United States Patent [19]

Cote

[11] 4,265,549

[45] May 5, 1981

[54] FLAT FLEXIBLE PRINTED CIRCUIT CABLE FOR A PRINT HEAD

[75] Inventor: Henry L. Cote, Bedford, N.H.

[73] Assignee: Centronics Data Computer Corp., Hudson, N.H.

[21] Appl. No.: 40,890

[22] Filed: May 21, 1979

[51] Int. Cl.³ .......................... B41J 3/12; H05K 1/00
[52] U.S. Cl. .......................... 400/124; 339/17 F; 361/398
[58] Field of Search ............... 400/124, 719; 361/398; 339/17 F

[56] References Cited

U.S. PATENT DOCUMENTS

| | | | |
|---|---|---|---|
| 2,703,853 | 3/1955 | Chrystie | 361/398 X |
| 3,929,214 | 12/1975 | Hebert | 400/124 |
| 3,963,108 | 6/1976 | Steinhausser | 400/124 |
| 4,051,941 | 10/1977 | Hebert | 400/124 |
| 4,165,940 | 8/1979 | Cacciola | 400/124 |

Primary Examiner—Paul T. Sewell
Attorney, Agent, or Firm—Weinstein & Sutton

[57] ABSTRACT

A print head of the dot matrix impact type is provided with a plurality of solenoid assemblies arranged in a circular array about the rearward portion of the print head. A thin flexible printed circuit cable encircles the solenoid assemblies and has imbedded therein thin flexible wires each terminating at one end in an exposed connecting terminal and connected at their opposite ends to a connector plug mounted upon the cable and adapted to releaseably receive a mating connector. Embedded in the cable are a plurality of flat rigid plates serving as a stiffening member, interlocking tab and tab receiving members, a clamping member having an elongated embracing tab and a locating member having a pair of locating tabs for positively locating and orienting the printed circuit cable relative to the solenoid assemblies and for securing the locating member to one of the solenoid assemblies to prevent the cable from sliding about the print head solenoid assembly array.

9 Claims, 6 Drawing Figures

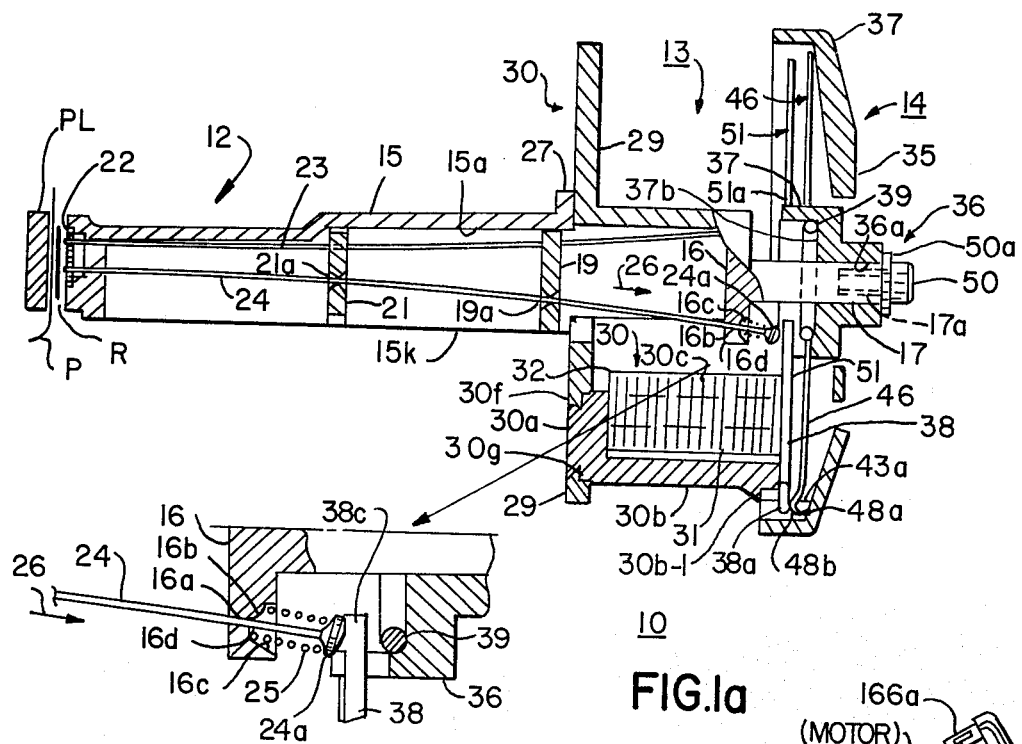
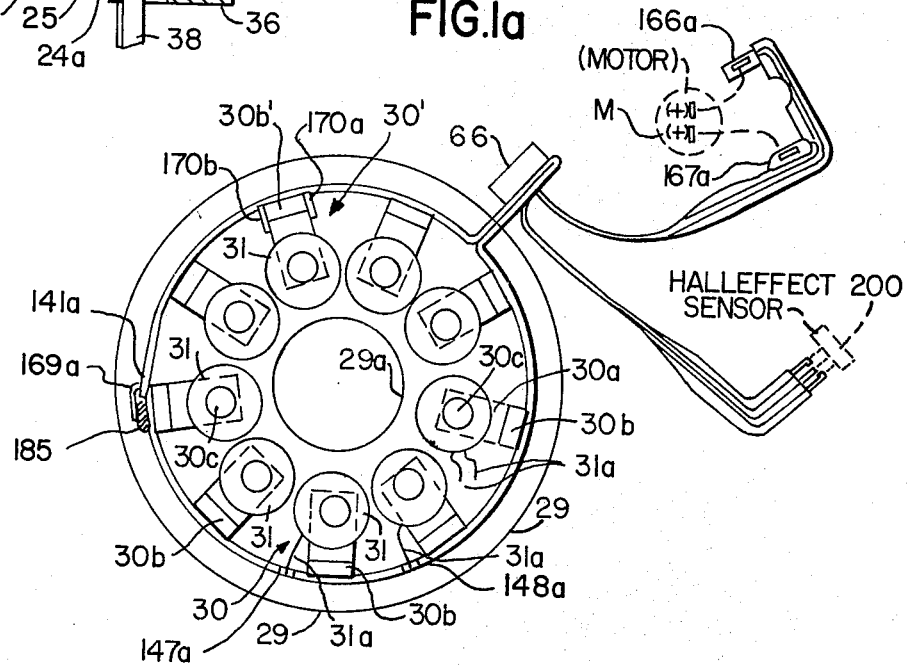
FIG.1a
FIG.1b

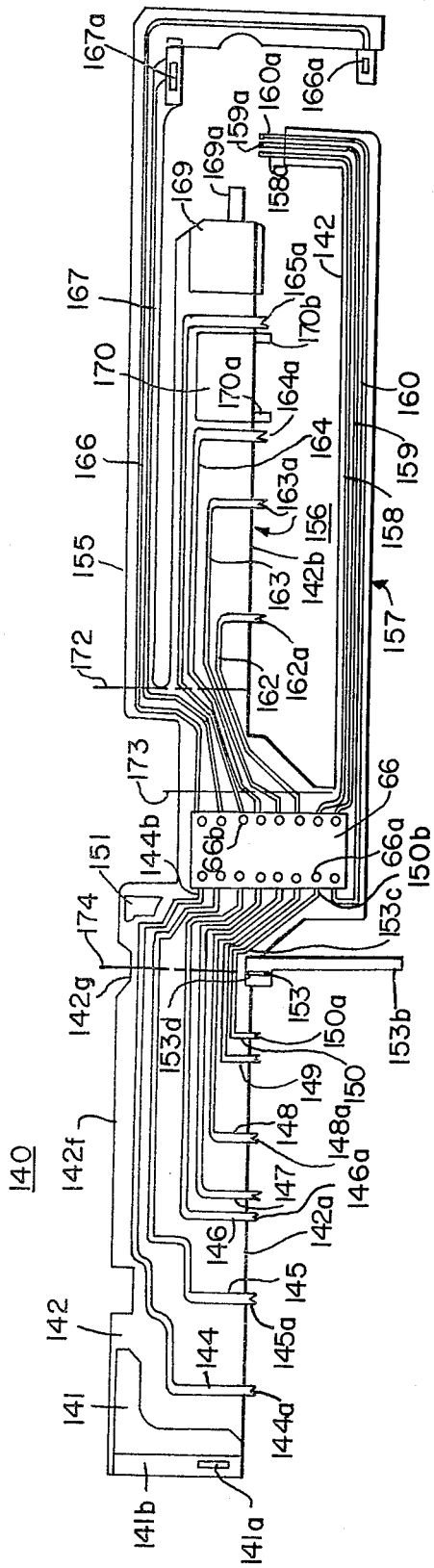
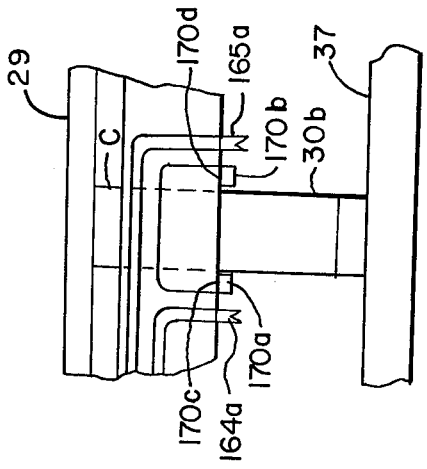
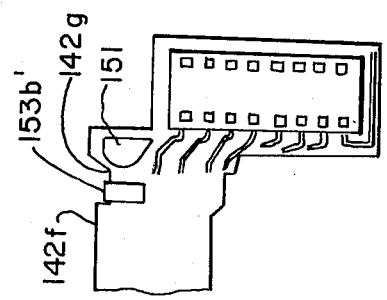
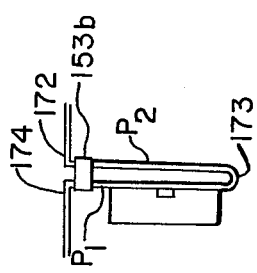

FLAT FLEXIBLE PRINTED CIRCUIT CABLE FOR A PRINT HEAD

BACKGROUND OF THE INVENTION

This invention relates to print heads and more particularly to a print head utilizing a printed circuit type cable to facilitate and simplify electrical connection of the print head solenoids to circuitry for driving the solenoids.

Print heads of the dot matrix type are typically comprised of a plurality of print wire driving solenoids each driving an associated print wire. One print head of this type is disclosed in copending Application Ser. No. 772,459 filed Feb. 28, 1977, now U.S. Pat. No. 4,165,940 issued Aug. 28, 1979. The print head disclosed therein is provided with a plurality of solenoids each comprised of a magnetic assembly, a coil wrapped about said assembly and an armature which is attracted to the magnetic assembly when current is passed through the coil. The moving armature drives a print wire in a forward direction causing the tip of the impact against a paper document, as is conventional in such apparatus.

The solenoid coils are electrically connected to a printed circuit by conductors extending to terminals in a flexible printed circuit member which is adapted to couple the solenoids to driver circuits remote from the print head. The operations required to make electrical connections between the solenoid coils and the printed circuit member are tedious and time consuming and, in addition the flexible printed circuit occupies an inordinate amount of space requiring a large amount of clearance space within the printer. Also, the manner in which the printed circuit is secured to the print head yields an awkward, impractical design which further complicates the operation, assembly, maintenance and repair of the print head.

BRIEF DESCRIPTION OF THE INVENTION

The present invention is characterized by comprising a dot matrix type print head which utilizes a thin flat flexible printed circuit cable adapted to encircle the rearward portion of the print head about which the solenoid assemblies are mounted. The cable is provided with thin flexible conductors embedded within the flat insulation sheet and arranged to terminate at spaced intervals along one longitudinal edge of flexible printed circuit cable, each termination being in the form of a bare conductor terminal for receiving and being soldered to an end terminal of an associated solenoid coil, for maintaining a taut condition between the bare conducting terminal and the end terminal wire of the solenoid coil which eliminates the need for independent insulation for the end terminal portions of the solenoid coil end terminal wire. The taut connection also serves to maintain the cable in a fixed position relative to the longitudinal axis of the print head.

The opposite ends of the flexible conductors extend along the cable and terminate in a dual-in-line socket type connector secured to one surface of the flexible printed surface cable. The flexible printed circuit cable is maintained in substantially intimate engagement about the periphery of the solenoid assemblies by means of rigid metallic plates imbedded within the flexible cable at opposite sidewise edges of the cable, one such insert having an exposed portion extending beyond the insulation and forming a bendable tab and other insert having an exposed portion extending beyond its associated edge of the insulation sheet being provided with a slot for receiving the aforesaid bendable tab, which slot and tab cooperate to form a locking closure for the printed circuit cable.

Additional rigid metallic insert sheets are provided at spaced intervals along the elongated flexible printed circuit cable which perform the functions of precisely locating the cable relative to the solenoids to prevent the encircling cable from revolving about the print head and thereby avoiding the possibility of a short-circuit condition between the bare conductor terminals and neighboring conductive members. This is accomplished by providing two locating tabs extending from a common insert and being arranged to a position abreast one of the solenoid assembly core members. Still another insert is provided with an elongated bendable tab for maintaining a portion of the printed circuit cable which is adapted to be retained in a folded condition. Still other inserts serve as stiffeners to rigidify certain critical portions of the printed circuit cable to prevent these sensitive portions from experiencing any undesirable bending of flexing.

The cable is wrapped about the solenoid mounting portion of the print head so as to be in intimate engagement therewith thereby placing the terminal connectors in close proximity to their end terminals of the solenoid coils, thereby greatly facilitating the electrical joining between these members. The closure arrangement comprised of the cooperating end tab and slot provide sufficient adjustment for the closure to assure that the flexible printed circuit cable intimately embraces the solenoid assembly array to prevent the flexible cable from experiencing any unnecessary movement and, to prevent the electrical connections between the solenoid coils and the cable from being disturbed and possibly even severed. The arrangement of the printed circuit cable in this manner significantly reduces the clearance space required for the print head and further simplifies assembly and disassembly, as mentioned hereinabove.

OBJECTS OF THE INVENTION AND BRIEF DESCRIPTION OF THE INVENTION

One object of the present invention is to provide flexible connector means for printheads and the like which is adapted to intimately encircle the elements to which connectors in the cable are to be electrically joined.

Still another object of the invention is to provide a novel flexible printed circuit cable for printheads and the like and comprising a rigid insert member for providing a locating function to positively locate the printed circuit cable relative to predetermined elements of the printhead.

Still another object of the invention is to provide a novel flexible printed circuit cable for use with printheads and the like in which the cable is provided with rigid insert members for locking the cable to the print head assembly.

Still another object of the present invention is to provide a novel flexible printed circuit cable for use with printheads and the like in which the flexible printed circuit cable is provided with rigid inserts serving as stiffeners to rigidify portions of the printed circuit cable thereby preventing undesirable bending.

Still another object of the present invention is to provide a novel flexible printed circuit cable for use with printheads and the like and comprising an insert member having tab means for maintaining a folded portion of the printed circuit cable in the folded orientation by means of said bendable tab means.

Still another object of the present invention is to provide a novel, flat flexible printed circuit cable for use with printheads and the like which also provides for electrical connections in addition those provided for the solenoid assemblies of the printhead and which are required as part of the overall assembly.

The above as well as other objects of the present invention will be covered within the accompanying description and drawings in which:

FIG. 1a shows a sectional view of the printhead assembly which may use the flexible printed circuit cable of the present invention to great advantage.

FIG. 1b shows a top plan view of the solenoid assembly array of the printhead of FIG. 1a with the rear parasol removed, exposing the solenoid assembly array and showing a flexible printed circuit cable designed in accordance with the principles of the present invention encircling said solenoid array.

FIG. 2 shows the flexible printed circuit cable of the present invention being laid flat and before mounting to the printhead assembly.

FIGS. 2a–2c show detailed views of portions of the printed circuit cable of FIG. 2.

DETAILED DESCRIPTION OF THE INVENTION

FIGS. 1a and 1b show a printhead assembly designed in accordance with the principles of the present invention. The print head assembly 10, which is described in detail in U.S. Pat. No. 4,165,940 referred to above, is adapted to be mounted upon a movable carriage and connected to suitable electrical control means (not shown for purposes of simplicity) through the flexible printed circuit member 140 (FIG. 2) for the purpose of selectively energizing solenoid coils 31 which cause the print wires 23, 24 to impact a ribbon R in order to print dots upon a paper document by transfer of the ink to the paper P. The paper P is supported by an inked platen PL. FIG. 1a is a sectional view of the free flight print head which is comprised of a nose cone assembly 12, a solenoid and pole plate assembly 13, and a parasol and armature biasing assembly 14.

Nose cone assembly 12 is comprised of a one-piece housing 15 open along one side 15k and having a rear wall 16 with a rearwardly extending projection 17 having a threaded aperture 17a. The nose cone assembly 12 may be covered by mounting the open side against the surface of the movable carriage (not shown). The rear wall 16 is provided with a plurality of tapered openings 16a which gradually increase in size from the inside rear wall to the outside thereof as shown at 16b, and then open into a large outwardly flaring opening 16c arranged to form a shoulder 16d between the bore portion 16b and the bore portion 16c. Only one such opening has been shown in detail (enlarged inset portion of FIG. 1a), it being understood that a plurality of such openings 16a are provided, one for each print wire 23,24.

The housing 15 is substantially hollow and has support grooves (not shown) arranged on the interior sidewalls thereof and adapted to receive and position the opposite sides of a partition 19 which serves as a guide plate for the print wires 23, 24. Partition 19 is provided with double tapered openings 19a somewhat similar to those provided in rear wall 16, for receiving each of the print wires 23, 24. A second pair of support grooves (not shown) are provided to receive and position the opposite sides of a second partition 21 having double tapered openings 21a also serving as a guide means for the print wires 23, 24. The tapered openings 21a serve to facilitate insertion of the print wires 23, 24 and, in both partitions, generally lie along an imaginary oval shaped line.

The partitions 19 and 21 need not be secured or epoxied into place since they are maintained in place by their cooperating grooves and by the print wires 23, 24. Thus, the partitions 19,21 serve to maintain relative positioning between and among the print wires but do not and need not precisely position the print wires relative to the nose cone 12.

The forward end of the nose cone assembly 12 is provided with a recess adapted to receive a low friction jewel bearing member 22 provided with a plurality of closely spaced generally circular shaped openings to align the forward ends or tips of the print wires 23, 24 along an imaginary straight line in closely spaced fashion to enable a vertically aligned dot pattern to be formed upon the paper document P.

FIG. 1a shows two typical print wires 23 and 24 which can be seen to be maintained in a generally curved condition between the jewel bearing 22 provided in the nose and the partitions 21 and 19 positioned rearward of the jewel bearing 22, as well as the rear wall 16. The print wires are generally of constant diameter over their length and are fitted at their rearward ends with end caps such as, for example, the end cap 24a fitted on the rear end of print wire 24. A helical spring 25 has its left-hand end (relative to FIG. 1a) seated within opening 16c and against shoulder 16d, and has its opposite end bearing against end cap 24a. As can clearly be seen, the helical spring 25 biases its print wire 24 in a direction shown by arrow 26.

The nose cone housing 15 has an integral flange 27, which flange 27 is provided with a pair of openings (not shown) for receiving the fastening members (not shown) which serve to secure pole plate 29 thereto. Pole plate 29 is part of the solenoid and pole plate assembly 13. As can best be seen from FIGS. 1a and 1b, the centrally located projection 17 is designed to be slidably received within an opening provided in a parasol 35 to accurately align the nose cone and its print wire end caps 24a relative to the armature assembly. Pole plate 29, shown best in FIG. 1b, is a substantially circular disc having a plurality of openings, each of said openings being adapted to receive a generally U-shaped pole piece 30 having a base portion 30a, and upright arm 30b of substantially rectangular cross-section, and an upright arm 30c of a substantially circular cross-section. Each pole piece has its circular shaped arm 30c arranged to lie closer to the central opening 29a of pole plate 29 and having its rectangular shaped arm 30b arranged to lie closer to the outer periphery of pole plate 29. As will be noted, each arm 30b is provided with a notch having a ledge 30b-1.

The pole pieces 30 are mounted to the pole plate 29. The arm 30c of each pole piece is adapted to receive a solenoid coil 31 wound upon a bobbin 32 having a circular shaped bore and which is fitted upon the arm 30c. The lead wires 31a of each coil 31 are led out to an associated terminal provided on the flexible printed circuit cable to be more fully described in connection with FIGS. 2–2c.

Although each armature 38 (FIG. 1a) can clearly be said to be part of each solenoid assembly, the manner in which they are mounted and the manner in which they function will be described after first considering the parasol and armature biasing assembly 14. The parasol and armature biasing assembly 14 is comprised of a parasol member 35 having a central portion 36 and an outer annular portion 37. The central portion 36 is provided with an opening 36a for receiving projection 17 of the nose cone housing 15. The central portion 36 comprises a substantially oval or elliptical shaped flange 37 provided with a plurality of slots (not shown) for slidably receiving the forward end of an associated armature element 38 which is comprised of a heel portion 38a and a tip portion 38c. The inner wall 37b of oval shaped flange 37 receives an energy absorbing resilient compressible O-ring 39 which is force-fittingly received therein and is adapted to absorb kinetic energy from the armatures 38.

The solenoid mounting assembly 13 may be employed in any application which employs a plurality of solenoids. The armatures may be utilized to drive members other than print wires while retaining the advantages of ease of adjustment of the gaps of the armature tips and their associated pole pieces.

FIG. 2 shows the thin flexible printed circuit cable 140 laid out flat, i.e. before being mounted upon the print head assembly 10. The left-hand end of the flexible printed circuit cable has a substantially L-shaped thin metallic member 141 partially embedded within the insulating material 142, the exposed portion 141b thereof having an elongateed slot 141a. A plurality of thin printed circuit leads 144-150 are likewise embedded within the thin flexible insulating material 142 which is preferably formed of thin insulating sheets. One free end of each said leads 144-150 extends beyond the lower edge 142a of the thin flexible plastic material 142 to form bare exposed joining terminals 144a-150a adapted to be electrically connected to, and preferably soldered to the end terminals 31a of the solenoid windings. The opposite ends of the conductive leads 144-150 are connected to electrical terminals 144b-150b arranged along one array 66a of the socket type connector 66 (note also FIG. 1b). The terminals 144a-150a have tapered V-shaped slots to facilitate alignment of a solenoid wire therein.

Another metallic insert 151 of substantially triangular shape is embedded within the plastic sheet 142 and serves to impart rigidity to the structure, as will be more fully described. Still another metallic insert sheet 153 of rectangular shape is embedded within the plastic material 142 along the lower edge 142a thereof and is provided with a "break" or perforated portion at 153a to facilitate bending of the metallic insert 153 along the "break". The insert 153 has an elongated bendable tab 153b extending downwardly from the right-hand portion 153c of metallic insert 153 and is designed to be bent in order to embrace two adjacent halves of the flat printed circuit cable as will be more fully described.

The flat printed circuit cable member extending to the right-hand side of the socket-type connector 66 divides into three flexible printed circuit sections 155, 156 and 157. Elongated section 157 is provided with three imbedded elongated conductors 158, 159 and 160 whose left-hand ends are connected to selected terminals of the right-hand contact array 66b of socket-type connector 66 while the opposite ends of the elongated conductors embedded within the thin insulating material 142 terminate in three exposed terminals 158a, 159a and 160a, respectively, said terminals being adapted for connection to a Hall effect sensor 200 shown in dotted fashion for purposes of simplicity, in FIG. 1b.

The middle section 156 of cable 140 is provided with connector leads 162-165 terminating in exposed connector terminals 162a-165a. The left-hand ends of flexible conductors 166 and 167 in section 155 are connected to selected ones of the terminals in the right-hand array 66b of socket-type connector 66. The opposite ends of flexible leads 166 and 167 terminate in exposed terminals 166a and 167a as shown in FIG. 1b, which terminals are adapted for electrical connection to a pair of terminals of a motor M shown in dotted fashion for purposes of simplicity.

The intermediate section 156 is further provided with a metallic insert 169 substantially embedded within the thin insulating sheet 142 and having an outwardly extending exposed projection 169a.

The manner in which the flexible printed circuit cable is utilized is as follows:

The flat flexible printed circuit cable is arranged so that it substantially encircles the portion of the print head assembly 10 in which the solenoid assemblies 30 are arranged (FIG. 1b). The thin rectangular shaped metallic insert 170, which is provided with a pair of tabs 170a and 170b extending beyond edge 142b of central section 156, is positioned so that the tabs 170a and 170b are arranged about the opposite sides of the magnetic core member 30b' of the solenoid assembly 30'. The tabs 170a and 170b are arranged to lie along the edges of the core member 30b' of solenoid assembly 30' between the solenoid mounting disc 29 and parasol 35 shown in FIG. 1a. Thereafter, the tabs 170a and 170b are bent inwardly along bend lines 170c and 170d (FIG. 2a) in order to embrace the magnetic core member 30b' of the solenoid assembly 30'. The flexible printed circuit cable is thus positively located relative to the solenoid assemblies 30. The flexible cable is bent along dotted lines 172, 173 and 174 so as to assume the configuration shown in FIG. 2b and also shown in FIG. 1b. The thin, bendable elongated tab 153b is bent about the folded over portions P1 and P2 of the flexible printed circuit cable 140 in the immediate region of bends 172 and 174 so as to retain the flat flexible printed circuit cable 140 in the configuration shown in FIG. 2b. The embedded metallic member 153 is adapted to be bent in half along dotted line 174 and is provided with a narrow elongated slot 153d colinear with imaginary line 174 to facilitate accurate location of this bend. The triangular-shaped element 151 serves as a stiffening member to impart stiffness to the region just to the right of the bent tab 153b whose marginal end portion 153b' can be seen to be bent downwardly over the recess 142g provided along the upper edge 142f of the flat flexible printed circuit cable 140 shown in FIG. 2c.

Thereafter, the flexible printed circuit cable 140 is maintained in the position intimately embracing the solenoid assemblies 30 of print head assembly 10 by positioning the exposed end 141b of metallic insert 141 immediately adjacent to the metallic insert 169 provided in intermediate section 156 and by inserting bendable tab 169a through elongated opening 141a in metallic insert 141 and bending tab 169a so that it lies adjacent to portion 169, thereby serving to mechanically secure the flexible printed circuit cable 140 to the print head assembly 10. This locking connection may be soldered, if desired, as shown at 185 in FIG. 1b.

The dual-in-line socket type connector 66 is adapted to receive a dual-in-line plug type connector with a plurality of pins extending therefrom for releasable securement into the sockets (i.e. openings) provided in the two arrays of the socket type member 66. This arrangement is shown, for example, in copending Application Ser. No. 40,898 filed May 21, 1979 by the assignee of the present invention. This connector is provided with a plurality of leads sufficient in number to electrically connect all of the components including the print head solenoids, the motor M and the Hall-effect sensor 200, to electrical circuitry arranged remote from the reciprocating carriage upon which the print head is mounted.

It can be seen that the present invention provides a novel thin flexible printed circuit cable which is adapted to encircle and intimately engage the solenoid assemblies to provide an extremely low profile for the printed circuit cable thereby significantly reducing the amount of clearance required for the cable as compared with conventional devices such as, for example, that shown in coopending Application Ser. No. 772,459 mentioned hereinabove.

A latitude of modification, change and substitution is intended in the foregoing disclosure and, in some instances some teachings of the invention will be employed without a corresponding use of other features. Accordingly, it is appropriate that the appended claims be construed broadly in a manner consistent with the spirit and scope of the invention herein.

What is claimed is:

1. A thin flat flexible printed circuit cable for use with a print head assembly having a plurality of solenoid assemblies arranged in a substantially circular array, said cable comprising:
   a thin flat elongated flexible insulating sheet having a plurality of flexible conductors imbedded therein;
   one end of each of said flexible conductors terminating along a longitudinal side of said sheet;
   each such termination comprising an exposed conductive terminal for electrical connection to each terminal of the solenoid coils of each solenoid assembly;
   said thin flat insulating sheet further incorporating a first substantially rigid insert imbedded in said sheet at a first end and having an exposed portion;
   said exposed portion having a slot;
   a second substantially rigid insert being imbedded in said sheet at the opposite end thereof and having an elongated tab extending outwardly from said opposite end and beyond said insulating sheet;
   said flexible printed circuit cable being wrapped around said array of solenoid assemblies;
   said tab being inserted through said slot and being bent so as to form a locking arrangement to maintain said flat flexible printed circuit cable in intimate engagement with the exterior surfaces of said solenoid coil assemblies.

2. The apparatus of claim 1 wherein said cable is further provided with a second substantially rigid insert imbedded in said insulating sheet and having a pair of tabs extending outwardly beyond one longitudinal side of said insulating sheet, said tabs being spaced a predetermined distance apart and being adapted to embrace one of said solenoid assemblies;
   said tabs being bent inwardly to embrace the opposing sides of said solenoid assembly, thereby positively locating the flexible printed circuit cable relative to said solenoid assemblies to prevent the cable assembly from revolving about the array of solenoid assemblies.

3. The apparatus of claim 1 further comprising a second rigid metallic insert imbedded in said insulating sheet and having an elongated bendable tab extending outwardly from one longitudinal edge of said sheet;
   a portion of said elongated printed circuit cable being bent to bring portions of said cable opposite said bend into intimate contact;
   said bendable tab being bent about the exterior surfaces of said portions and being in intimate contact therewith to maintain the engaging portions in the aforesaid intimate contact.

4. The apparatus of claim 3 further comprising a connector member mounted upon said printed circuit cable immediately adjacent the aforesaid bend;
   each of said flexible conductors imbedded within said insulating sheet having their opposite ends terminating in said connector member.

5. The apparatus of claim 3 further comprising a third rigid insert imbedded within said insulating sheet and arranged in close proximity to said bent elongated tab to stiffen the printed circuit cable in the region of said bend.

6. The apparatus of claim 1 wherein said bare terminals are each provided with a V-shaped slot to facilitate electrical connection of a solenoid coil terminal lead thereto.

7. The apparatus of claim 3 further comprising a connector member mounted upon said printed circuit for releasably receiving a cooperating connector.

8. A thin flat flexible printed circuit cable for use with a print head assembly having a plurality of solenoid assemblies arranged in a substantially circular array, said cable comprising:
   a thin flat elongated flexible insulating sheet having a plurality of flexible conductors imbedded therein;
   one end of each of said flexible conductors terminating along a longitudinal side of said sheet;
   each such termination comprising an exposed conductive terminal for electrical connection to each terminal of the solenoid coils of each solenoid assembly;
   said flexible printed circuit cable being wrapped around said array of solenoid assemblies to position the opposite ends of said sheet substantially adjacent one another;
   means for coupling said ends together to retain said sheet about said array.

9. The apparatus of claim 7 wherein said cable is further provided with a first substantially rigid insert imbedded in said insulating sheet and having a pair of tabs extending outwardly beyond one longitudinal side of said insulating sheet, said tabs being spaced a predetermined distance apart and being adapted to embrace one of said solenoid assemblies;
   said tabs being bent inwardly to embrace the opposing sides of said solenoid assembly, thereby positively locating the flexible printed circuit cable relative to said solenoid assemblies to prevent the cable assembly from revolving about the array of solenoid assemblies.

* * * * *